(12) United States Patent
Choi et al.

(10) Patent No.: US 10,741,126 B2
(45) Date of Patent: Aug. 11, 2020

(54) TRANSISTOR ASSEMBLY, AND ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventors: HongRak Choi, Bucheon-si (KR); SeHee Park, Daegu (KR); PilSang Yun, Daegu (KR); HyungJoon Koo, Daegu (KR); Kwanghwan Ji, Daegu (KR); Jaeyoon Park, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 118 days.

(21) Appl. No.: 15/828,194

(22) Filed: Nov. 30, 2017

(65) Prior Publication Data
US 2018/0151114 A1  May 31, 2018

(30) Foreign Application Priority Data

Nov. 30, 2016 (KR) .................. 10-2016-0162108

(51) Int. Cl.
*G09G 3/325* (2016.01)
*H01L 27/32* (2006.01)
(Continued)

(52) U.S. Cl.
CPC ........... *G09G 3/325* (2013.01); *G09G 3/3233* (2013.01); *H01L 27/1255* (2013.01);
(Continued)

(58) Field of Classification Search
CPC ............... H01L 27/3262; H01L 27/124; H01L 27/3248; H01L 27/3258; H01L 27/1218; H01L 27/1214; H01L 27/1251; H01L 27/1237; H01L 27/3225; H01L 27/1248; H01L 27/12; H01L 27/1259; H01L 29/786; H01L 27/1255; H01L 27/3244; H01L 27/3265; H01L 27/3246; H01L 29/4908;
(Continued)

(56) References Cited

U.S. PATENT DOCUMENTS

| 7,557,382 B2 * | 7/2009 | Koh ..................... G09G 3/3225 257/82 |
| 7,709,842 B2 * | 5/2010 | Jung ................... H01L 27/3244 257/59 |

(Continued)

FOREIGN PATENT DOCUMENTS

| CN | 103765494 A | 4/2014 |
| CN | 104538401 A | 4/2015 |

(Continued)

OTHER PUBLICATIONS

Kawamura, T., et al. "1.5-V Operating Fully-Depleted Amorphous Oxide Thin Film Transistors Achieved by 63-mV/dec Subthreshold Slope," *Hitachi, Ltd., Central Research Laboratory* 1-280, Higashi-koigakubo, Kokubunji-shi, Tokyo 185-8601, Japan.

*Primary Examiner* — Dismery Mercedes
(74) *Attorney, Agent, or Firm* — Seed IP Law Group LLP (57) ABSTRACT

Disclosed are a transistor assembly, an organic light emitting display panel including the same, and an organic light emitting display device including the organic light emitting display panel, in which a first electrode of a switching transistor is used as a gate of a driving transistor.

17 Claims, 10 Drawing Sheets

(51) Int. Cl.
*H01L 27/12* (2006.01)
*G09G 3/3233* (2016.01)
*G02F 1/1676* (2019.01)

(52) U.S. Cl.
CPC ...... *H01L 27/3248* (2013.01); *H01L 27/3258* (2013.01); *H01L 27/3262* (2013.01); *H01L 27/3265* (2013.01); *H01L 27/3276* (2013.01); *G02F 1/1676* (2019.01); *G09G 2300/0426* (2013.01); *G09G 2300/0814* (2013.01); *G09G 2300/0852* (2013.01); *G09G 2310/0251* (2013.01); *G09G 2310/0262* (2013.01)

(58) Field of Classification Search
CPC ........... H01L 2227/323; G02F 1/13338; G02F 1/133603; G02F 1/136286; G09G 3/3233; G09G 3/3208; G09G 3/3258; G09G 3/325; G09G 3/3291; G09G 2300/0439
See application file for complete search history.

(56) References Cited

U.S. PATENT DOCUMENTS

| | | | |
|---|---|---|---|
| 9,147,719 B2* | 9/2015 | Kim | H01L 27/326 |
| 9,299,757 B2* | 3/2016 | Ko | H01L 27/3265 |
| 9,349,781 B2 | 5/2016 | Park et al. | |
| 9,356,076 B2* | 5/2016 | Wang | H01L 27/323 |
| 9,390,655 B2 | 7/2016 | Jeong et al. | |
| 9,412,297 B2 | 8/2016 | Kim | |
| 9,412,303 B2 | 8/2016 | Kim et al. | |
| 9,412,876 B2 | 8/2016 | Koezuka et al. | |
| 9,564,478 B2 | 2/2017 | Chang et al. | |
| 9,786,224 B2 | 10/2017 | Kim et al. | |
| 9,935,163 B2* | 4/2018 | Han | H01L 27/3265 |
| 10,074,707 B2* | 9/2018 | Kim | H01L 27/1259 |
| 10,199,446 B2* | 2/2019 | Kim | H01L 27/3246 |
| 10,276,607 B2* | 4/2019 | Lou | H01L 27/1251 |
| 2001/0019384 A1 | 9/2001 | Murade | |
| 2008/0106207 A1 | 5/2008 | Yoon et al. | |
| 2012/0140424 A1 | 6/2012 | Sato | |
| 2013/0214279 A1* | 8/2013 | Nishimura | G02F 1/13624 257/59 |
| 2014/0158995 A1 | 6/2014 | Park | |
| 2014/0167040 A1 | 6/2014 | Lee et al. | |
| 2014/0332768 A1 | 11/2014 | Kwon et al. | |
| 2015/0053935 A1 | 2/2015 | Gupta et al. | |
| 2015/0108438 A1* | 4/2015 | Kim | H01L 27/3258 257/40 |
| 2015/0155363 A1 | 6/2015 | Nakazawa et al. | |
| 2015/0187959 A1 | 7/2015 | Yoon | |
| 2015/0243722 A1* | 8/2015 | Kwon | H01L 27/3262 257/40 |
| 2016/0005803 A1 | 1/2016 | Ryu et al. | |
| 2016/0254282 A1 | 9/2016 | Lv et al. | |
| 2016/0322453 A1 | 11/2016 | Park et al. | |
| 2016/0343737 A1* | 11/2016 | Zhang | H01L 29/78678 |
| 2017/0358688 A1* | 12/2017 | Lee | H01L 29/78603 |
| 2018/0033805 A1 | 2/2018 | Gupta et al. | |
| 2018/0122882 A1 | 5/2018 | Lee et al. | |

FOREIGN PATENT DOCUMENTS

| | | |
|---|---|---|
| CN | 105793995 A | 7/2016 |
| WO | 2011/135908 A1 | 11/2011 |

* cited by examiner

TRANSISTOR ASSEMBLY, AND ORGANIC LIGHT EMITTING DISPLAY PANEL AND ORGANIC LIGHT EMITTING DISPLAY DEVICE INCLUDING THE SAME

CROSS-REFERENCE TO RELATED APPLICATIONS

This application claims the benefit of the Korean Patent Application No. 10-2016-0162108 filed on Nov. 30, 2016.

BACKGROUND

Technical Field

The present disclosure relates to a transistor assembly, an organic light emitting display panel including the same, and an organic light emitting display device including the organic light emitting display panel.

Discussion of the Related Art

Flat panel display (FPD) devices are applied to various kinds of electronic products such as portable phones, tablet personal computers (PCs), notebook PCs, etc. Examples of the FPD devices (hereinafter simply referred to as a display device) include liquid crystal display (LCD) devices, organic light emitting diode (OLED) display devices, etc. Recently, electrophoretic display devices (EPDs) are being widely used as a type of FPD device.

As a type of FPD device (hereinafter simply referred to as a display device), organic light emitting display devices have a fast response time of 1 ms or less and a low consumption power, and thus, are attracting much attention as next generation display devices.

Figure 1:
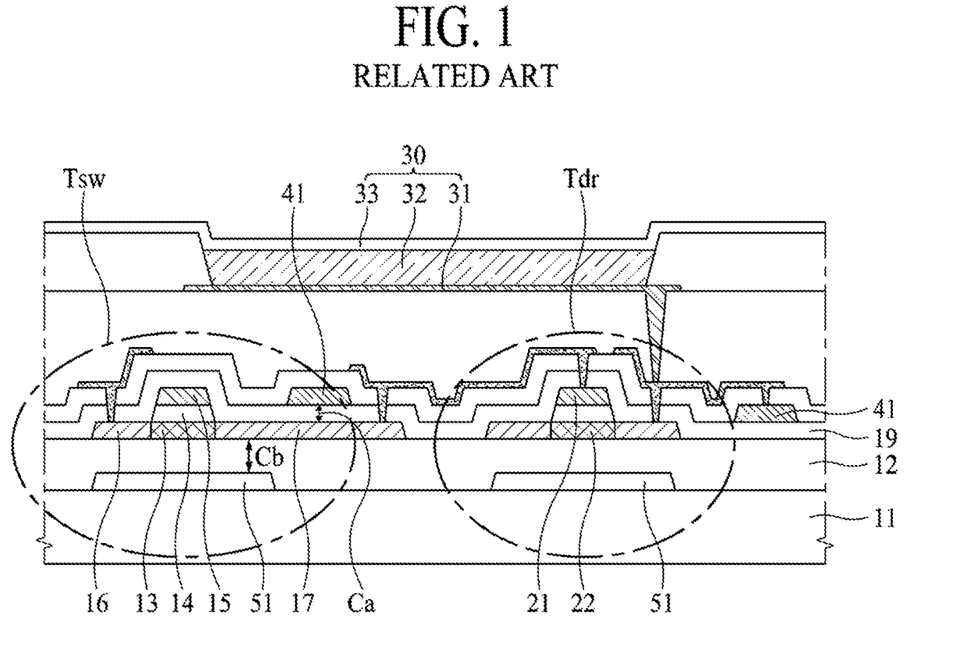
FIG. 1 is an exemplary diagram illustrating a cross-sectional surface of a related art organic light emitting display panel.
Figure 2:
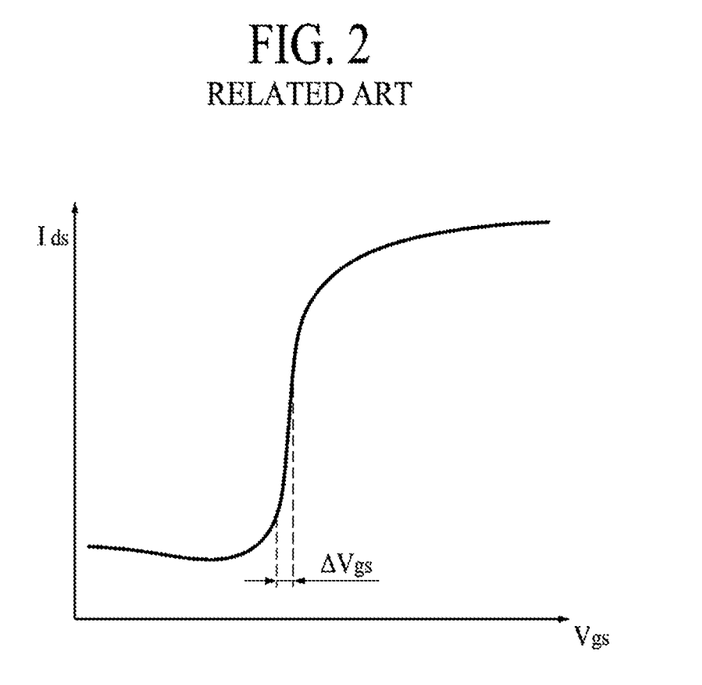
FIG. 2 is a graph showing a relationship between a current and a gate-source voltage of a driving transistor of the related art organic light emitting display panel.

FIG. 1 is an exemplary diagram illustrating a cross-sectional surface of a related art organic light emitting display panel, and FIG. 2 is a graph showing a relationship between a current and a gate-source voltage of a driving transistor of the related art organic light emitting display panel.

The related art organic light emitting display panel, as illustrated in FIG. 1, includes a switching transistor Tsw connected to a gate line and a data line, an organic light emitting diode (OLED) 30 including an anode 31, a light emitting layer 32, and a cathode 33, and a driving transistor Tdr connected to the anode 31 and the switching transistor Tsw. A second electrode 16 of the switching transistor Tsw is connected to the data line, a first electrode 17 of the switching transistor Tsw is connected to a gate 21 of the driving transistor Tdr, and a gate 15 of the switching transistor sw is connected to the gate line.

In order to increase a storage capacitance between the gate 21 of the driving transistor Tdr and the anode 31, in the related art organic light emitting display panel, a thickness of a gate insulation layer 14 or an insulation layer 19 is thinly set. Also, in the related art, as illustrated in FIG. 1, metal 51 is used for increasing the storage capacitance.

To provide an additional description, a first capacitance Ca is generated between the first electrode 17 of the switching transistor Tsw and a capacitance electrode 41 connected to the anode 31, and a second capacitance Cb is generated between the first electrode 17 and the metal 51. The first capacitance Ca and the second capacitance Cb constitute the storage capacitance. In FIG. 1, two capacitance electrodes referred to by reference numeral 41 are illustrated like being separated from each other in the drawing, but substantially, are electrically connected to each other.

In order to enhance a characteristic of the switching transistor Tsw, a thickness of the gate insulation layer 14 may be reduced. However, if the thickness of the gate insulation layer 14 is reduced, a characteristic of the driving transistor Tdr is degraded.

For example, in order to enhance the characteristic of the switching transistor Tsw, if the thickness of the gate insulation layer 14 or the insulation layer 19 is thinly set, as shown in FIG. 2, a width "$\Delta Vgs$" of a period where the driving transistor Tdr is turned on and thus a current increases is considerably narrowed.

The width "$\Delta Vgs$" being narrowed denotes that a width of a voltage representing a gray level of a color is narrowed. For example, when voltages corresponding to the width "$\Delta Vgs$" are divided into 256 voltages, 256 colors are realized.

Therefore, there is a limitation in thinly setting the thickness of the gate insulation layer 14.

Moreover, in order to increase the storage capacitance, as illustrated in FIG. 1, the related art organic light emitting display panel including the capacitance electrode 41 and the metal 51 additionally needs a mask for forming the capacitance electrode 41 and the metal 51. Also, an area of the capacitance electrode 41 is reduced by contact holes, causing the reduction in level of the storage capacitance.

BRIEF SUMMARY

Accordingly, the present disclosure is directed to provide a transistor assembly, an organic light emitting display panel including the same, and an organic light emitting display device including the organic light emitting display panel that substantially obviate one or more problems due to limitations and disadvantages of the related art.

An aspect of the present disclosure is directed to provide a transistor assembly, an organic light emitting display panel including the same, and an organic light emitting display device including the organic light emitting display panel, in which a first electrode of a switching transistor is used as a gate of a driving transistor. In one embodiment, this first electrode is the source region of the switching transistor.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a transistor assembly including a substrate, a switching channel provided on the substrate, a gate insulation layer provided on the switching channel to overlap a switching active part configuring the switching channel, a switching gate provided on the gate insulation layer to overlap the switching active part, a first insulation layer covering the switching channel, the gate insulation layer, and the switching gate, a driving channel provided on the first insulation layer, a second insulation layer covering the driving channel and the first insulation layer, a first electrode connected to a first conductor part configuring the switching channel and provided on the second insulation layer, and a second electrode connected to a second conductor part configuring the switching channel and provided on the second insulation layer. Here, the first conductor part configuring the switching channel is disposed to overlap a driving active part configuring the driving channel.

In another aspect of the present disclosure, there is provided an organic light emitting display panel including the transistor assembly, a passivation layer covering the first electrode, the second electrode, and the second insulation layer, and an organic light emitting diode provided on the passivation layer.

In another aspect of the present disclosure, there is provided an organic light emitting display device including the organic light emitting display panel, a gate driver supplying a gate pulse to a plurality of gate lines included in the organic light emitting display panel, a data driver respectively supplying data voltages to a plurality of data lines included in the organic light emitting display panel, and a controller controlling the gate driver and the data driver.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 3:
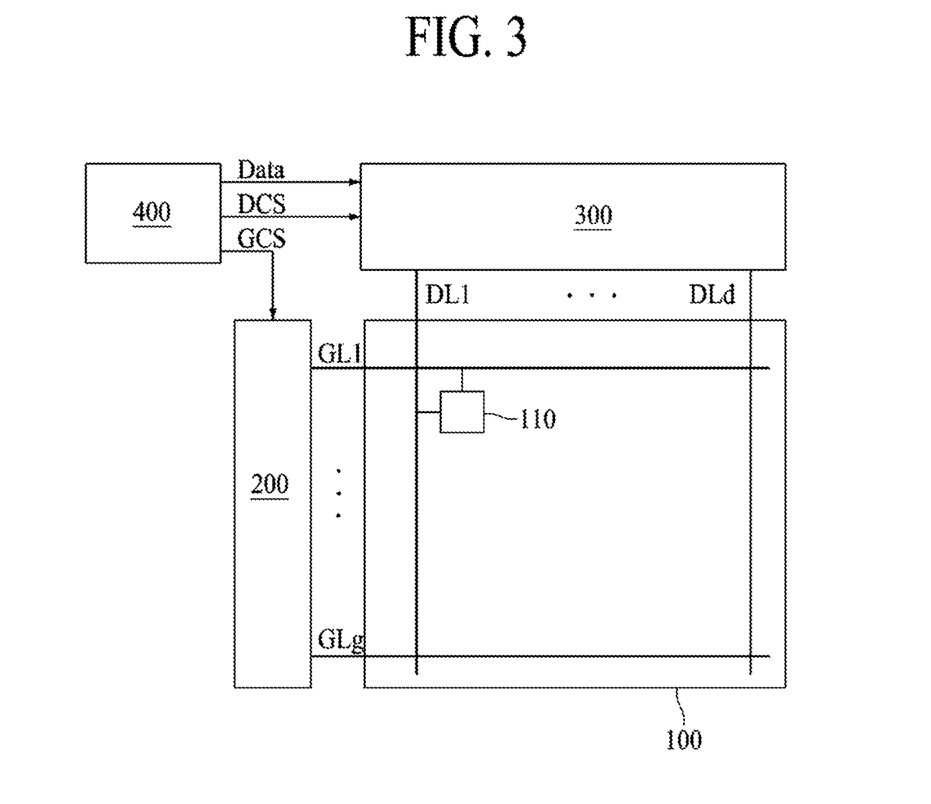
FIG. 3 is an exemplary diagram illustrating a configuration of an organic light emitting display device according to an embodiment of the present disclosure.
Figure 4:
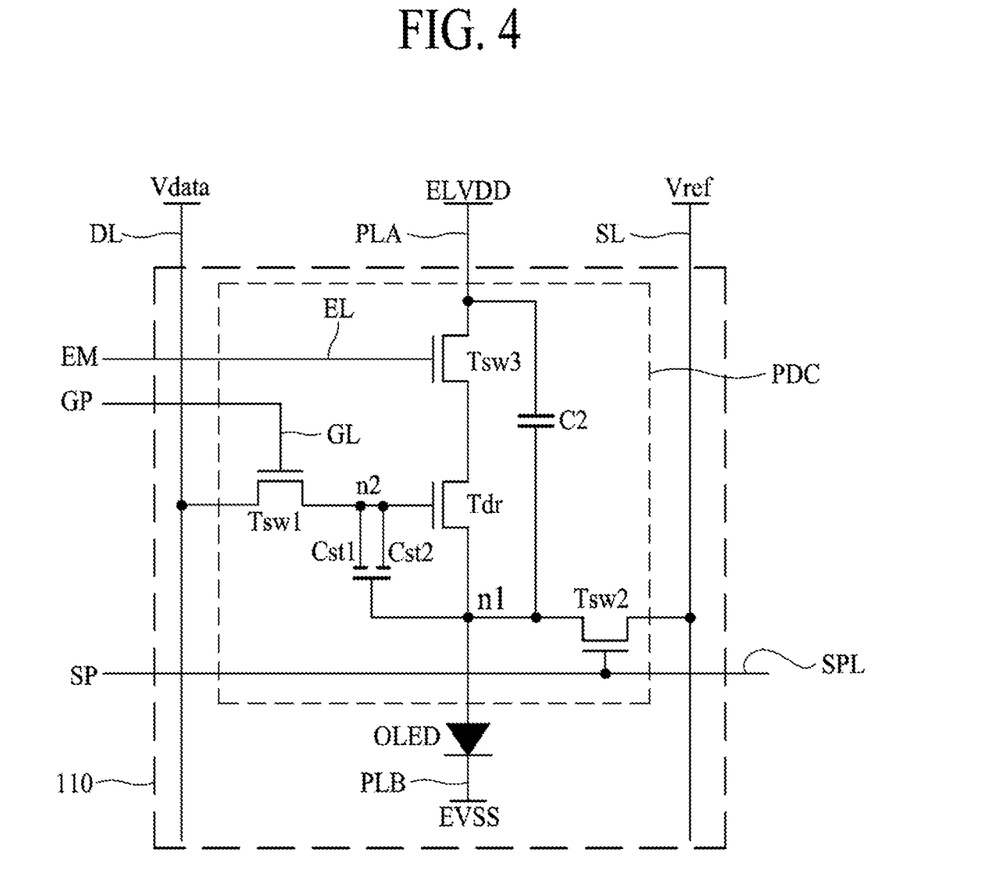
FIG. 4 is a diagram illustrating a configuration of a pixel included in an organic light emitting display panel according to an embodiment of the present disclosure.

FIG. 3 is an exemplary diagram illustrating a configuration of an organic light emitting display device according to an embodiment of the present disclosure, and FIG. 4 is a diagram illustrating a configuration of a pixel included in the organic light emitting display panel according to an embodiment of the present disclosure.

The organic light emitting display device according to an embodiment of the present disclosure, as illustrated in FIG. 3, may include an organic light emitting display panel 100 where a plurality of pixels 110 defined by a plurality of gate lines GL1 to GLg and a plurality of data lines DL1 to DLd are provided to display an image, a gate driver 200 which sequentially supplies a gate pulse to the gate lines GL1 to GLg included in the organic light emitting display panel 100, a data driver 300 which respectively supplies data voltages to the data lines DL1 to DLd included in the organic light emitting display panel 100, and a controller 400 which controls the gate driver 200 and the data driver 300.

First, the organic light emitting display panel 100 may include the gate lines GL1 to GLg through which the gate pulse is supplied, the data lines DL1 to DLd through which the data voltages are supplied, and the pixels 100 defined by the gate lines GL1 to GLg and the data lines DL1 to DLd. Each of the pixels 100 may include at least one thin film transistor (hereinafter simply referred to as a transistor).

Each of the pixels 110 included in the organic light emitting display panel 100, as illustrated in FIG. 4, may include an organic light emitting diode OLED which emits light and a pixel driver PDC which drives the organic light emitting diode OLED. A plurality of signal lines DL, EL, GL, PLA, PLB, SL, and SPL for supplying a driving signal to the pixel driver PDC may be provided in each of the pixels 110.

A data voltage Vdata may be supplied through a data line DL, a gate pulse GP may be supplied through a gate line GL, a first driving power EVDD may be supplied through a power supply line PLA, a second driving power EVSS may be supplied through a driving power line PLB, a reference voltage Vref may be supplied through a sensing line SL, a sensing pulse SP for turning on/off a sensing transistor Tsw2 may be supplied through a sensing pulse line SPL, and an emission control line EM for driving an emission transistor Tsw3 may be supplied through an emission line EL.

For example, as illustrated in FIG. 4, the pixel driver PDC may include a switching transistor Tsw1 which is connected to the gate line GL and the data line DL, a driving transistor Tdr which controls a level of a current output from the organic light emitting diode OLED according to the data voltage Vdata transferred through the switching transistor Tsw1, the sensing transistor Tsw2 which senses a characteristic of the driving transistor Tdr, and the emission transistor Tsw3 which controls an emission timing of the driving transistor Tdr.

A storage capacitance Cst may be provided between a gate of the driving transistor Tdr and an anode of the organic light emitting diode OLED. The storage capacitance Cst may be referred to as a first capacitance.

A second capacitance C2 may be provided between the organic light emitting diode OLED and a terminal, supplied with the first driving power, of terminals of the emission transistor.

The switching transistor Tsw1 may be turned on by the gate pulse supplied through the gate line GL and may transfer the data voltage Vdata, supplied through the data line DL, to the gate of the driving transistor Tdr.

The sensing transistor Tsw2 may be connected to the sensing line SL and a first node n1 between the driving transistor Tdr and the organic light emitting diode OLED and may be turned on/off by the sensing pulse SP. In a sensing period, the sensing transistor Tsw2 may sense the characteristic of the driving transistor Tdr.

A second node n2 connected to the gate of the driving transistor Tdr may be connected to the switching transistor Tsw1. The storage capacitance Cst may be provided between the second node n2 and the first node n1. As the storage capacitance Cst increases, a driving characteristic of the driving transistor Tdr is enhanced.

The emission transistor Tsw3 may transfer the first driving power EVDD to the driving transistor Tdr or may cut off the first driving power EVDD, based on the emission control signal EM. When the emission transistor Tsw3 is turned on, a current may be supplied to the driving transistor Tdr, and thus, light may be emitted from the organic light emitting diode OLED.

In addition to a structure illustrated in FIG. 4, the pixel driver PDC may be configured in various structures.

Each of the transistors included in the pixel driver PDC may be an oxide thin film transistor (TFT).

The transistors may be provided in a non-display area outside a display area where the pixels are provided. For example, when the gate driver 200 is built into the non-display area of the organic light emitting display panel 100, each of transistors configuring the gate driver 200 may also be an oxide TFT, depending on the drive signal applied to the gate of Tdr.

Therefore, all transistors included in the organic light emitting display panel may be formed through the same process.

Subsequently, the controller 400 may output a gate control signal GCS for controlling the gate driver 200 and a data control signal DCS for controlling the data driver 300, based on a timing signal (for example, a vertical sync signal, a horizontal sync signal, a clock, etc.) supplied from an external system. The controller 400 may sample input video data received from the external system and may realign the sampled video data to supply digital image data, obtained through the realignment, to the data driver 300.

Subsequently, the data driver 300 may convert the image data input from the controller 400 into analog data voltages Vdata and may transfer the data voltages Vdata for one horizontal line to the data lines DL1 to DLd at every one horizontal period where the gate pulse GP is supplied to one gate line GL.

Finally, the gate driver 200 may sequentially supply the gate pulse to the gate lines GL1 to GLg of the organic light emitting display panel 100 in response to the gate control signal GCS input from the controller 400. Therefore, transistors included in each of pixels 110 supplied with the gate pulse may be turned on, and each of the pixels 110 may display an image. The gate driver 200 may be provided independently from the organic light emitting display panel 100 and may be electrically connected to the organic light emitting display panel 100 in various types, but is not limited thereto. In other embodiments, the gate driver 200 may be provided as a gate-in panel (GIP) type which is built into the organic light emitting display panel 100.

Hereinabove, each of the data driver 300, the gate driver 200, and the controller 400 has been described as being independently provided. However, at least one of the data driver 300 and the gate driver 200 may be configured as one body with the controller 400.

Figure 5:
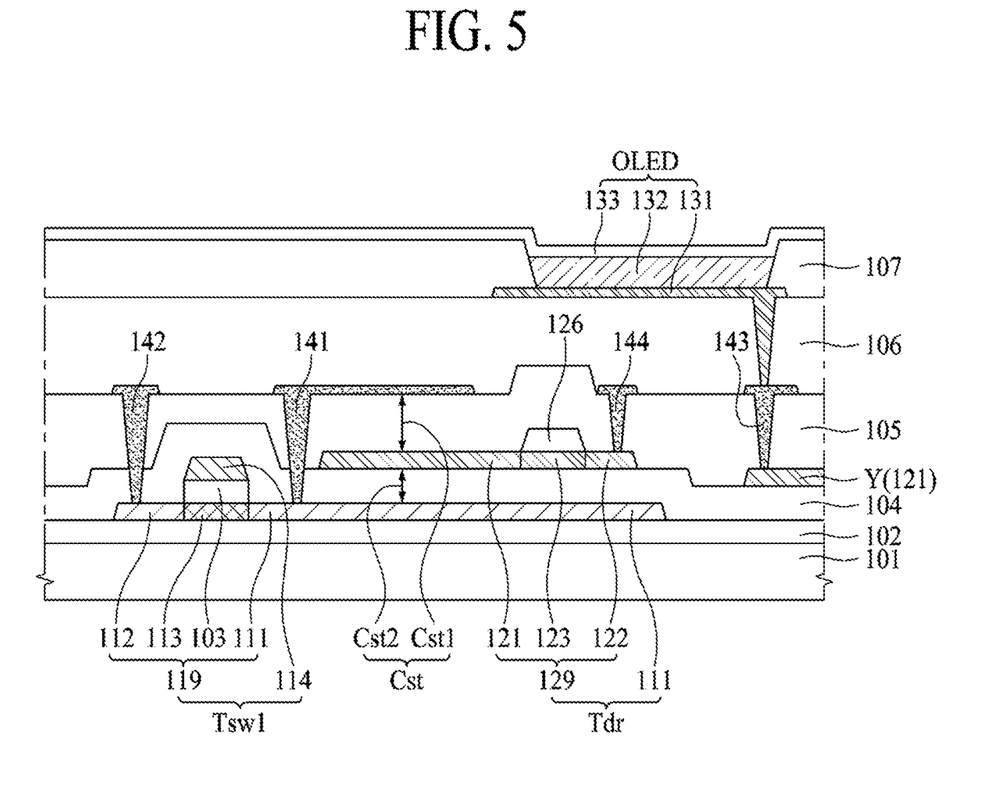
FIG. 5 is an exemplary diagram illustrating a cross-sectional surface of one pixel of an organic light emitting display panel according to an embodiment of the present disclosure.

FIG. 5 is an exemplary diagram illustrating a cross-sectional surface of one pixel of an organic light emitting display panel 100 according to an embodiment of the present disclosure.

The organic light emitting display panel 100 according to an embodiment of the present disclosure, as illustrated in FIG. 5, may include a substrate 101, a switching channel 119, a driving channel 129, a gate insulation layer 103, a switching gate 114, a first insulation layer 104, a blocking layer 126, a second insulation layer 105, a first electrode 141, a second electrode 142, a third electrode 143, a fourth electrode 144, a passivation layer 106, and an organic light emitting diode OLED. In the below-described organic light emitting display panel 100 according to an embodiment of the present disclosure, except for the passivation layer 106 and the organic light emitting diode OLED, a transistor assembly according to an embodiment of the present disclosure may be provided. That is, the transistor assembly according to an embodiment of the present disclosure may include the substrate 101, the switching channel 119, the driving channel 129, the gate insulation layer 103, the switching gate 114, the first insulation layer 104, the blocking layer 126, the second insulation layer 105, the first electrode 141, the second electrode 142, the third electrode 143, and the fourth electrode 144 among the elements illustrated in FIG. 5. Therefore, the transistor assembly according to an embodiment of the present disclosure is not separately described.

The substrate 101 may be a glass substrate, a plastic substrate, or the like.

Before the switching channel 119 is provided, a buffer layer 102 may be provided on the substrate 101. The buffer layer 102 may be formed of an organic material, an inorganic material, and/or the like.

The switching channel 119 may be provided on the substrate 101 or the buffer layer 102. The switching channel 119 may include a switching active part 113 formed of an oxide semiconductor, and a first conductor part 111 and a second conductor part 112 respectively provided in both ends of the switching active part 113. In most instances of operation, the first conductor part 111 will be a source region of the switching transistor Tsw1 and the second conductor part 112 will be a drain region of the switching transistor Tsw1.

In one embodiment, the switching channel 119 corresponds to the switching transistor Tsw1 of FIG. 4.

The first conductor part 111 of the switching channel 119 may be disposed to overlap the driving active part 123 of the driving channel 129. Therefore, the first conductor part 111 configuring the switching channel 119 may perform a function of a gate of the driving transistor Tdr (i.e., a function of the driving gate). Accordingly, according to an embodiment of the present disclosure, the number of contact holes is reduced. As can be seen in FIG. 4, the source of the switching transistor Tsw1 is connected to the gate of the driving transistor Tdr. In the embodiment of FIG. 5, it is both the physical and electrical element. Namely, the source region itself of Tsw1 is the physical gate of the drive transistor Tdr. The same physical structure 111 also provides the electrical signal for both the source of a first transistor, Tsw1, and the gate of another transistor, Tdr.

The gate insulation layer 103 may be provided on the switching channel 119 to overlap the switching active part 113 configuring the switching channel 119. The gate insulation layer 103 may be formed of an organic material or an inorganic material.

The switching gate 114 may be provided on the gate insulation layer 103 to overlap the switching active part 113.

The switching channel 119, the gate insulation layer 103, and the switching gate 114 may be covered by the first insulation layer 104.

A thickness of the gate insulation layer 103 and a thickness of the first insulation layer 104 may be differently set. Particularly, a thickness of the first insulation layer 104 of the driving transistor Tdr may be set greater than that of the gate insulation layer 103 of the switching transistor Tsw. Therefore, a characteristic of the switching transistor Tsw is enhanced by decreasing the thickness of the gate insulation layer 103 of the switching transistor Tsw, and a characteristic between a current Ids and a gate-source voltage Vgs of the driving transistor Tdr is enhanced by increasing the thickness of the first insulation layer 104 of the driving transistor Tdr. An acceptable material for the insulation layer 104 is silicon oxide; another acceptable material is a combination of silicon nitride and silicon oxide. Silicon dioxide alone has a dielectric constant of about 3.9; silicon nitride has a higher dielectric constant, which can be in the range of about 7.5-7.9 or depending on how it is formed, might be in the range of 9.5-10.5. A combination of layers of silicon dioxide and silicon nitride, each having a selected thickness, can be used for the first insulation layer 104 to provide balance to achieve the desired properties of the first insulation layer 104 as used for both the gate insulator of driving transistor 129 and for the dielectric of capacitor Cst2.

The driving channel 129 may be provided on the first insulation layer 104. The driving channel 129 may include a driving active part 123 formed of an oxide semiconductor, and a third conductor part 121 and a fourth conductor part 122 respectively provided in both ends of the driving active part 123. The driving active part 123 may be formed of an oxide semiconductor. In the embodiment of FIG. 5, the driving channel 129 corresponds to the driving transistor Tdr and the third conducting part is the source of that transistor and the fourth conducting part is the drain of that transistor. The respective electrical connections of the source and drain of Tdr can be seen in FIG. 4 and they are not shown in FIG. 5 because they are not in the same plane as the cross-section of FIG. 5 and also because such connections locations and how to make them are known to those skilled in the art.

The first conductor part 111 of the switching channel 119 may be disposed to overlap the third conductor part 121 of the driving channel 129. The third conductor part 121 may be connected to an anode 131 of the organic light emitting diode OLED.

Therefore, a storage capacitance may be provided between the first conductor part 111 of the switching channel 119 and the third conductor part 121 of the driving channel 129.

The storage capacitance provided between the first conductor part 111 of the switching channel 119 and the third conductor part 121 of the driving channel 129 may be referred to as a second storage capacitance Cst2. This is also shown in FIG. 4

The capacitor Cst is therefore comprised of the parts of two capacitors, Cst1 and Cst2. The source region of drive transistor Tdr, which is the third conductive region acts as a first electrode for the capacitor Cst, which is common electrode for the two capacitors. The first conductor part 111 of the switching channel of the switching transistor is a second electrode of the capacitor Cst. The first electrode 141 is another second electrode of the capacitor Cst, which is physically separate from the other second electrode, first conductor part 111, but electrically at the same voltage level.

The second insulation layer 105 may cover the driving channel 129 and the first insulation layer 104. The second insulation layer 105 may be formed of an organic material or an inorganic material.

The blocking layer 126 may be provided on the driving channel 129 to overlap the driving active part 123 configuring the driving channel 129. The blocking layer 126 may be used to form the driving active part 123.

For example, when performing a process of forming a carrier in the third and fourth conductor parts 121 and 122 of the driving channel 129 by using plasma, the blocking layer 126 may block the plasma. Therefore, in the driving channel 129, both ends uncovered by the blocking layer 126 may become conductive, and thus, the third conductor part 121 and the fourth conductor part 122 may be formed.

To this end, the blocking layer 126 may be formed of at least one of various materials for blocking plasma. For example, the blocking layer 126 may be formed of opaque metal, or may be formed of an organic material or an inorganic material for blocking plasma.

The blocking layer 126 may be covered by the second insulation layer 105.

However, the blocking layer 126 may be omitted in some embodiments.

For example, by using a separate mask instead of the blocking layer 126, the third conductor part 121 and the fourth conductor part 122 may be formed.

Moreover, after the third conductor part 121 and the fourth conductor part 122 are formed, the blocking layer 126 may be removed.

The first electrode 141 may be provided on the second insulation layer 105. The first electrode 141 may be connected to the first conductor part 111 of the switching channel 119 through a contact hole, as shown in FIG. 5.

The first electrode 141 may be formed of at least one of various kinds of metals.

The first electrode 141 may be disposed to overlap the third conductor part 121 of the driving channel 129. The third conductor part 121 of the driving channel 129 may be connected to the anode 131 of the organic light emitting diode OLED.

Therefore, the storage capacitance may be provided by the third conductor 121 configuring the driving channel 129 and the first electrode 141.

The storage capacitance provided by the third conductor 121 of the driving channel 129 and the first electrode 141 may be referred to as a first storage capacitance Cst1. This is also shown in FIG. 4.

The storage capacitance Cst may be provided by the first storage capacitance Cst1 and the second storage capacitance Cst2.

To provide an additional description, the storage capacitance Cst provided between the second node n2 and the first node n1 may be provided by at least one of the first storage capacitance Cst1 and the second storage capacitance Cst2. In an embodiment of the present disclosure, the storage capacitance Cst necessary for driving of the driving transistor Tdr may be provided by at least one of the first storage capacitance Cst1 and the second storage capacitance Cst2, The second electrode 142 may be provided on the second insulation layer 105. The second electrode 142 may be connected to the second conductor part 112 configuring the switching channel 119.

The third electrode 143 may be provided on the second insulation layer 105. The third electrode 143 may be connected to the third conductor part 121 configuring the driving channel 129.

The third electrode 143 may be connected to the anode 131.

The fourth electrode 144 may be provided on the second insulation layer 105. The fourth electrode 44 may be connected to the fourth conductor part 122 configuring the driving channel 129.

The passivation layer 106 may cover the first electrode 141, the second electrode 142, the third electrode 143, the fourth electrode 144, and the second insulation layer 105. The passivation layer 106 may be formed of an organic layer or at least one layer including an organic material. The passivation layer 106 may planarize an upper end of each of the first electrode 141, the second electrode 142, the third electrode 143, the fourth electrode 144, and the second insulation layer 105.

The organic light emitting diode OLED may be provided on the passivation layer 106. The organic light emitting diode OLED may include the anode 131, a light emitting layer 132, and a cathode 133.

The anode 131 of the organic light emitting diode OLED may be connected to the third conductor part 121 of the driving channel 129 through the third electrode 143. In FIG. 5, an auxiliary electrode Y connected to the third electrode 143 may be separated from the third conductor part 121 of the driving channel 129. However, the auxiliary electrode Y may be substantially connected to the third conductor part 121 of the driving channel 129. Therefore, the auxiliary electrode Y and the third conductor part 121 of the driving channel 129 may be provided as one body.

The organic light emitting diode OLED may be surrounded by a bank 107. Each of pixels may be divided by the bank 107.

Figure 9A:
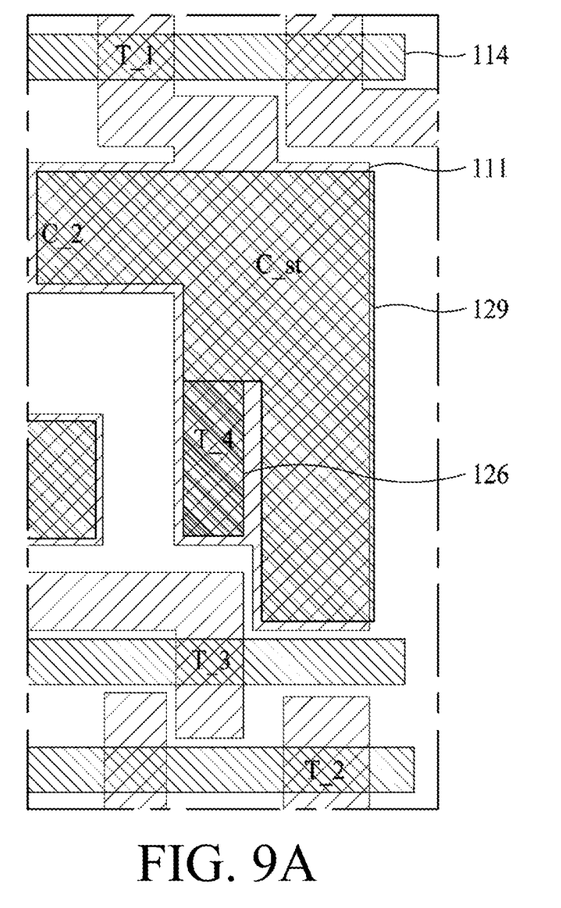
FIGS. 9A and 9B are exemplary diagrams for describing a method of manufacturing an organic light emitting display panel according to an embodiment of the present disclosure.
Figure 9B:
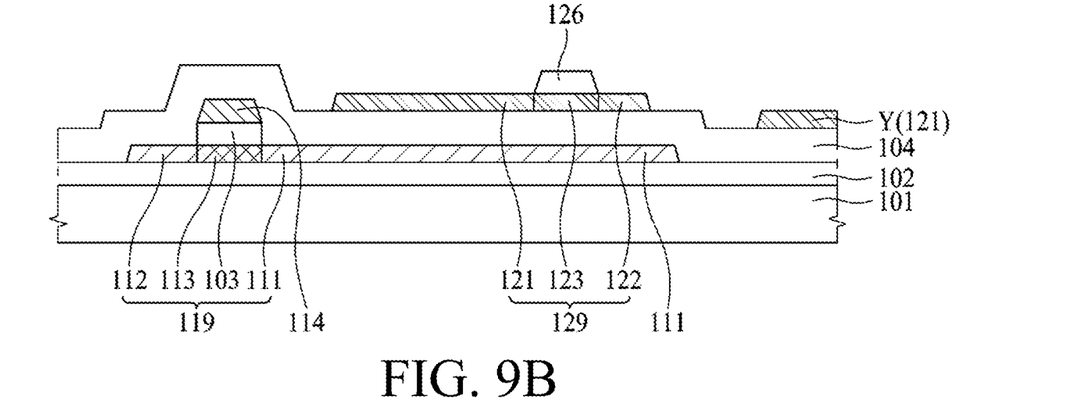
Figure 10A:
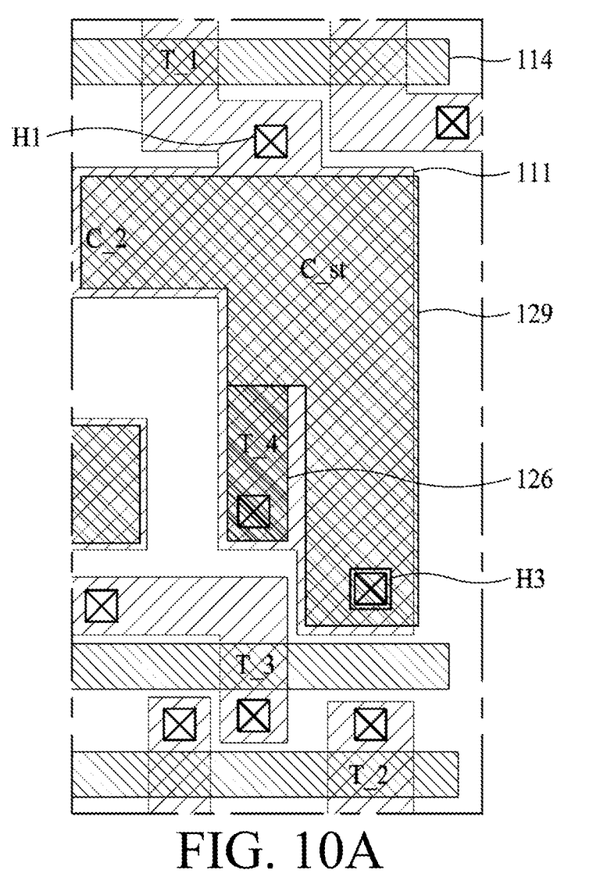
FIGS. 10A and 10B are exemplary diagrams for describing a method of manufacturing an organic light emitting display panel according to an embodiment of the present disclosure.
Figure 10B:
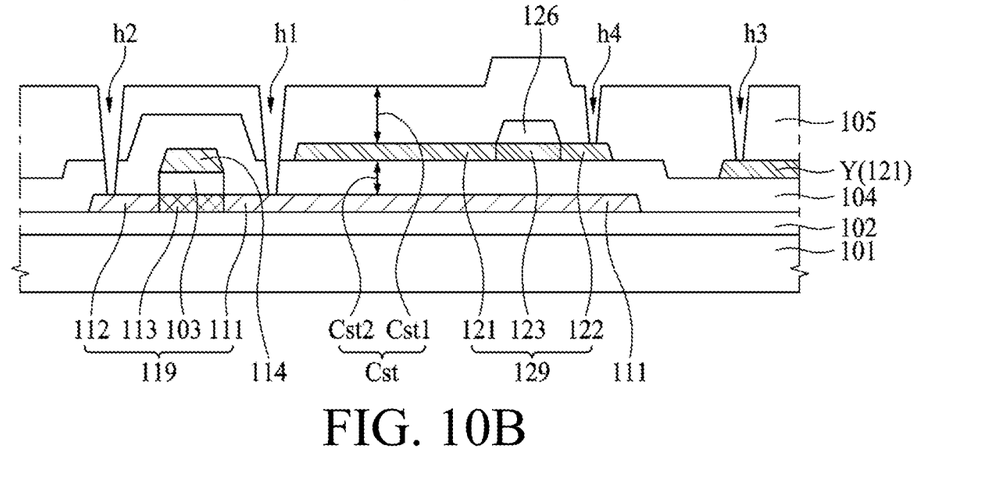
Figure 11A:
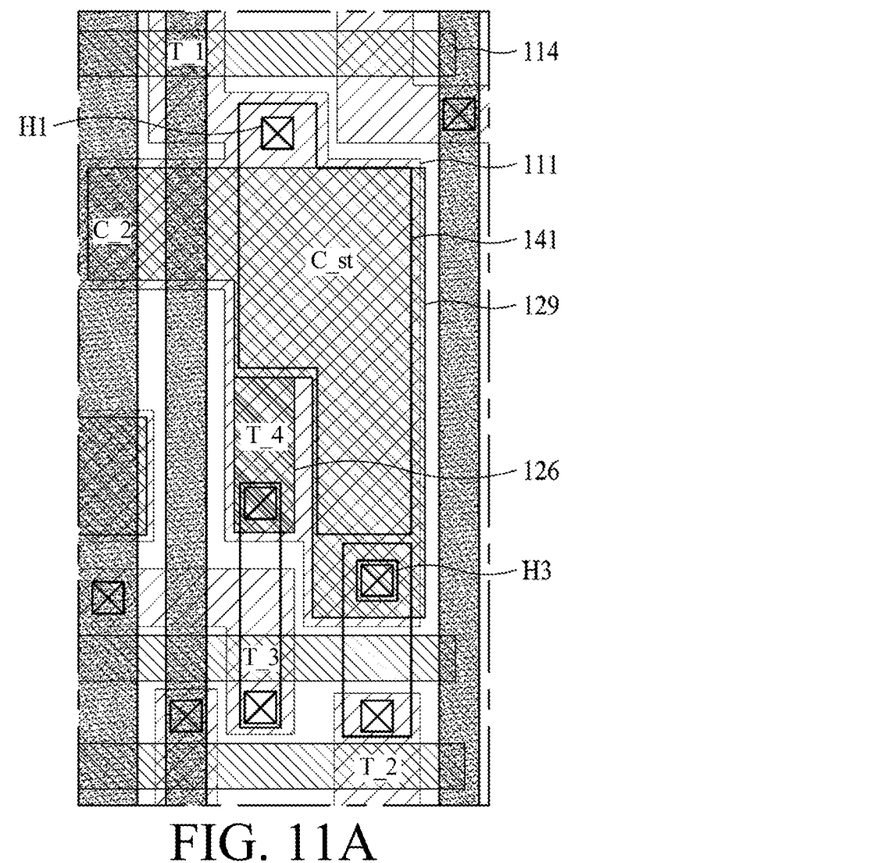
FIGS. 11A and B are exemplary diagrams for describing a method of manufacturing an organic light emitting display panel according to an embodiment of the present disclosure.
Figure 11B:
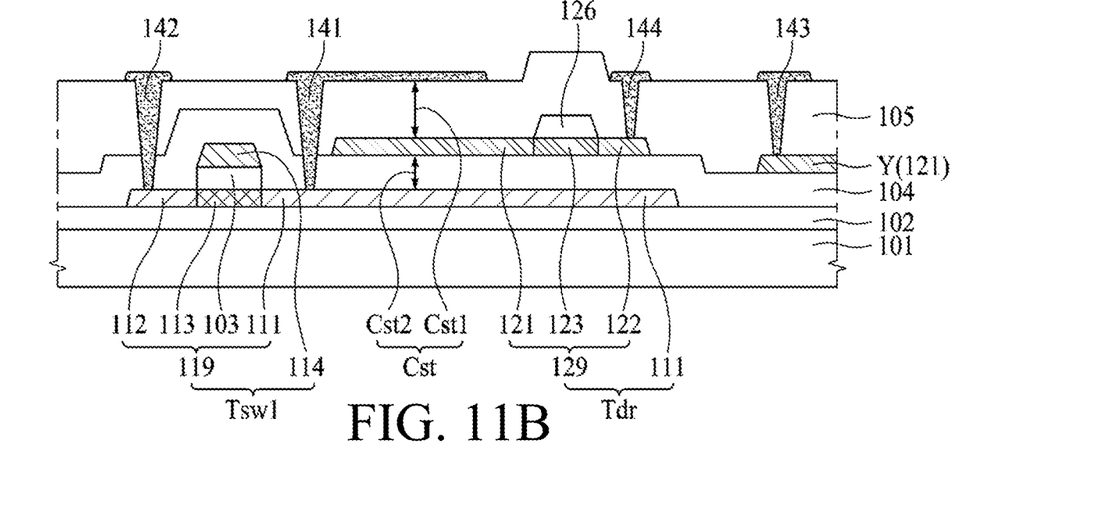

FIGS. 6A to 11B are exemplary diagrams for describing a method of manufacturing an organic light emitting display panel according to an embodiment of the present disclosure. In FIGS. 6A to 11A illustrate a plane of one pixel of the organic light emitting display panel, and FIG. 11B illustrates a cross-sectional surface of one pixel of the organic light emitting display panel. In the following description, details which are the same as or similar to the details described above with reference to FIGS. 3 to 5 are omitted or will be briefly described.

Figure 6A:
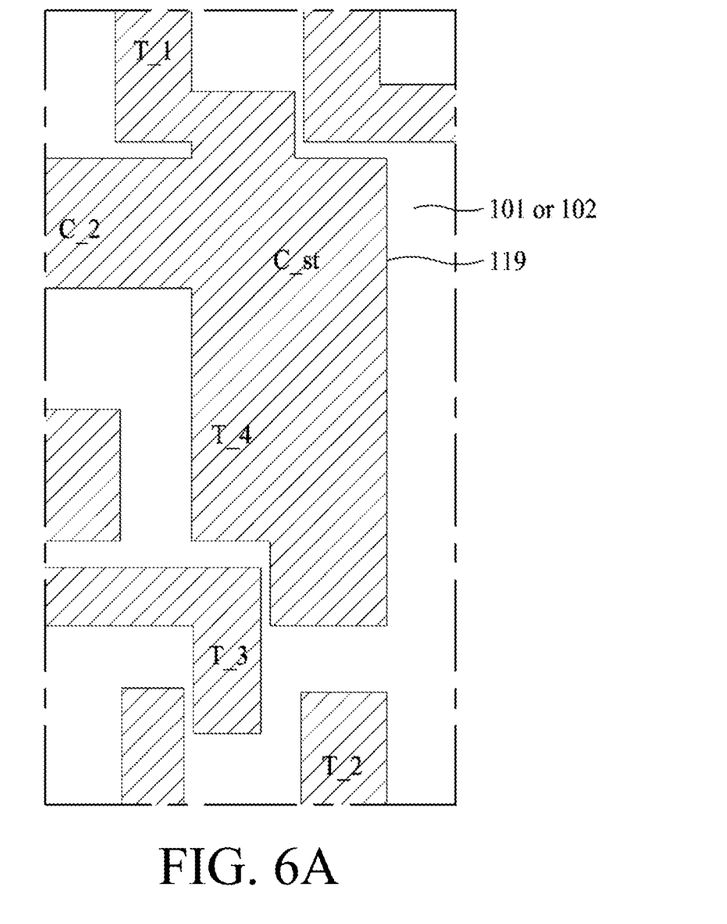
FIGS. 6A and 6B are exemplary diagrams for describing a method of manufacturing an organic light emitting display panel according to an embodiment of the present disclosure.
Figure 6B:
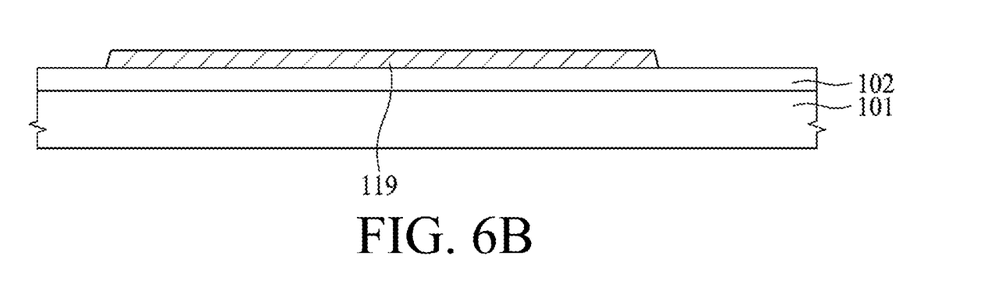

First, as illustrated in FIGS. 6A and 6B, by using a first mask, the switching channel 118 including an oxide semiconductor may be formed on the substrate 101 or the buffer layer 102. In FIG. 6A, in addition to the switching channel 119 and the driving channel 129, channels applied to other transistors included in the one pixel are illustrated. In FIGS. 7 to 11 described below, elements applied to the other transistors are illustrated. In the following description, a process of forming the storage capacitance Cst will be mainly described. In FIG. 6A, through below-described processes, the storage capacitance Cst may be formed in an area referred to by C_st, and the second capacitance C2 may be formed in an area referred to by C_2. Also, through below-described processes, the switching transistor Tsw may be formed in an area referred to by T_1, the sensing transistor Tsw2 may be formed in an area referred to by T_2, the emission transistor Tsw3 may be formed in an area referred to by T_3, and the driving transistor Tdr may be formed in an area referred to by T_4.

Subsequently, the switching channel 119 may be covered by a gate insulating material for forming the gate insulation layer 103.

Figure 7A:
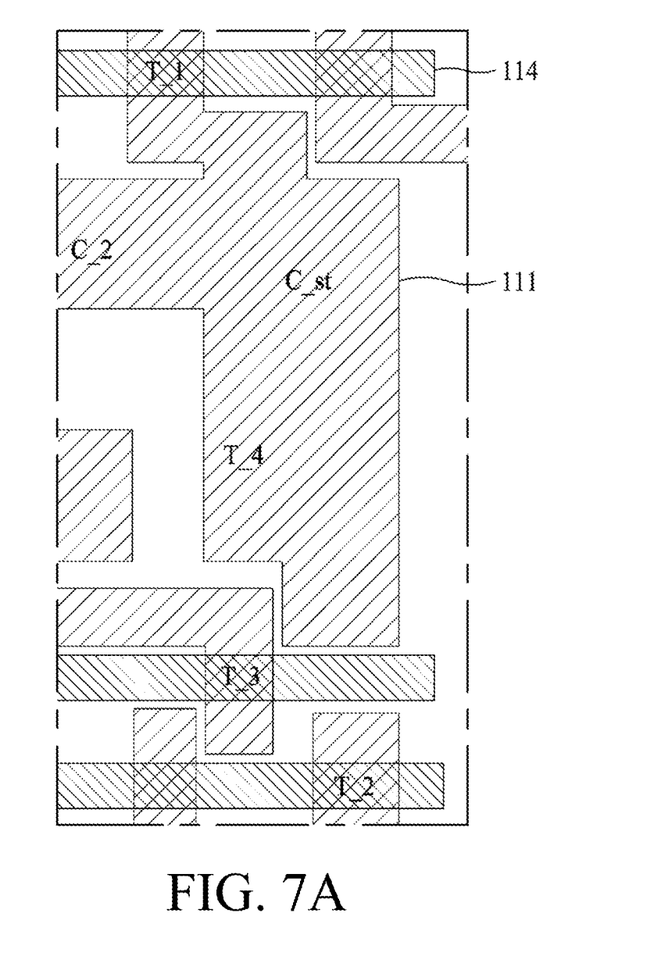
FIGS. 7A and 7B are exemplary diagrams for describing a method of manufacturing an organic light emitting display panel according to an embodiment of the present disclosure.
Figure 7B:
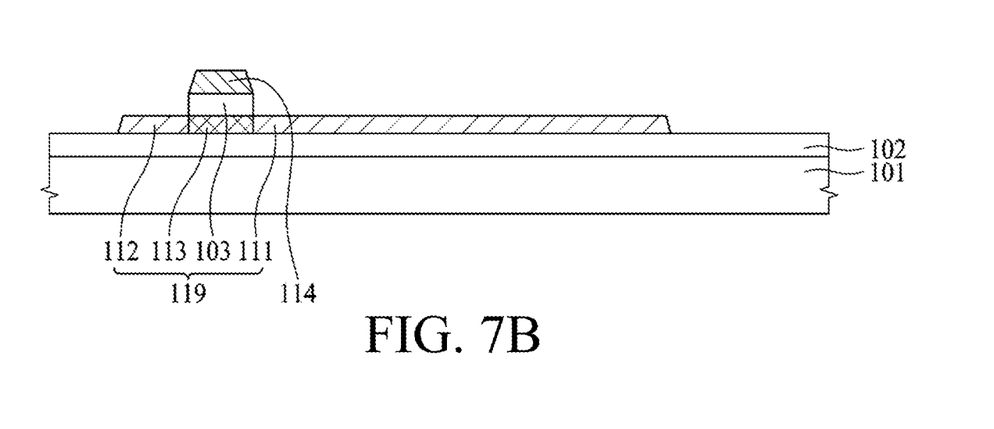

Subsequently, as illustrated in FIGS. 7A and 7B, by using a second mask, the switching gate 114 may be formed on an upper end of the gate insulating material.

Subsequently, as illustrated in FIGS. 7A and 7B, in a dry etching process, by using the switching gate 114 as a mask, the gate insulating material may be etched, and thus, the gate insulation layer 103 may be formed.

Subsequently, plasma may be sprayed on the substrate 101. In this case, in the switching channel 119, carriers may increase in an area uncovered by the switching gate 114 and the gate insulation layer 103, and thus, the area uncovered by the switching gate 114 and the gate insulation layer 103 may be changed to a conductor.

Therefore, as illustrated in FIGS. 7A and 7B, the switching active part 113, the first conductor part 111, and the second conductor part 112 may be formed.

Subsequently, the switching channel 119, the gate insulation layer 103, and the switching gate 114 may be covered by the first insulation layer 104.

Figure 8A:
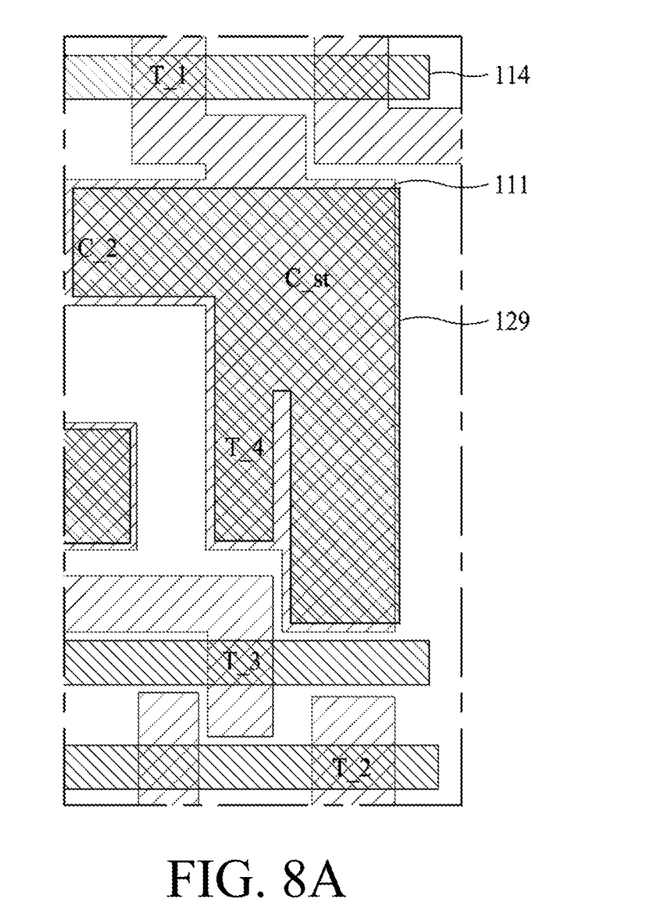
FIGS. 8A and 8B are exemplary diagrams for describing a method of manufacturing an organic light emitting display panel according to an embodiment of the present disclosure.
Figure 8B:
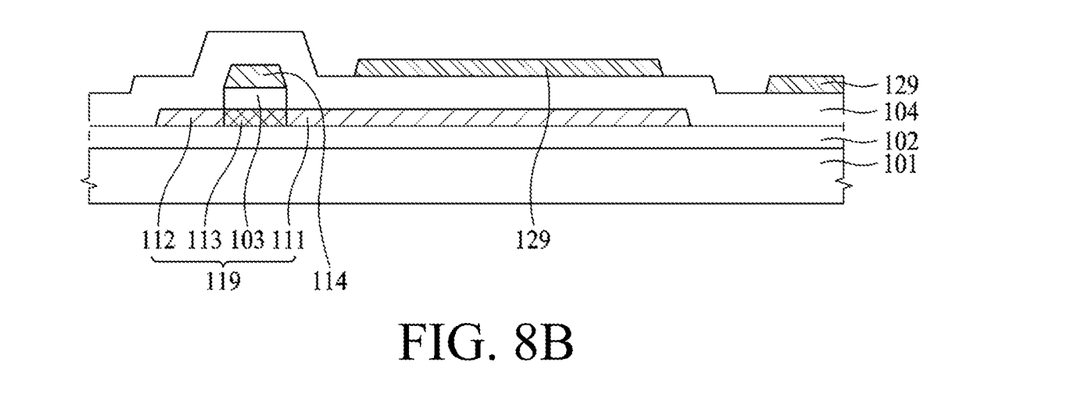

Subsequently, as illustrated in FIGS. 8A and 8B, by using a third mask, the driving channel 129 may be provided on the first insulation layer 104.

Subsequently, by using a fourth mask, the blocking layer 126 may be provided on the driving channel 129 to overlap the driving active part 123 of the driving channel 129.

Subsequently, plasma may be sprayed on the substrate 101. In this case, in the driving channel 129, carriers may increase in an area uncovered by the blocking layer 126, and thus, the area uncovered by the blocking layer 126 may be changed to a conductor.

Therefore, as illustrated in FIGS. 9A and 9B, the driving active part 123 and the third and fourth conductor parts 121 and 122 of the driving channel 129 may be formed.

In an alternative embodiment, if the blocking layer 126 is not formed, the driving active part 123 and the third and fourth conductor parts 121 and 122 of the driving channel 129 may be formed by using the fourth mask.

Subsequently, the driving channel 129 and the first insulation layer 104 may be covered by the second insulation layer 105.

Subsequently, as illustrated in FIGS. 10A and 10B, by using a fifth mask, a plurality of contact holes may be formed. The plurality of contact holes may include a first contact hole H1 exposing the first conductor part 111 of the switching channel 119, a second contact hole H2 exposing the second conductor part 112 of the switching channel 119, a third contact hole H3 exposing the third conductor part 121 of the driving channel 129, and a fourth contact hole H4 exposing the fourth conductor part 122 of the driving channel 129.

Subsequently, as illustrated in FIGS. 11A and 11B, by using a sixth mask, the first electrode 141, the second electrode 142, the third electrode 143, and the fourth electrode 144 may be formed.

Therefore, the switching transistor Tsw1 and the driving transistor Tdr may be formed.

Moreover, the first storage capacitance Cst1 may be formed between the third conductor part 121 of the driving channel 129 and the first electrode 141, and the second storage capacitance Cst2 may be formed between the first conductor part 111 configuring the switching channel 119 and the first electrode 141.

Subsequently, the first electrode 141, the second electrode 142, the third electrode 143, the fourth electrode 144, and the second insulation layer 105 may be covered by the passivation layer 106.

Finally, the organic light emitting diode OLED may be formed on the passivation layer 106. The anode 131 may be connected to the third conductor part 121 of the driving channel 129 through a contact hole passing through the passivation layer 106.

As described above, according to the embodiments of the present disclosure, a desired storage capacitance is secured even without decreasing a thickness of the gate insulation layer. Accordingly, a characteristic between the current Ids and the gate-source voltage Vgs of the driving transistor is enhanced.

Moreover, according to the embodiments of the present disclosure, since the first electrode of the switching transistor is used as the gate of the driving transistor, a large-scale storage capacitance is secured. Namely the area of the capacitor is increased to include both the first electrode of the source of the transistor Tsw1 and to also include the first conductor part 111 itself that is in the switching channel 119.

Moreover, according to the embodiments of the present disclosure, since the first electrode of the switching transistor is used as the gate of the driving transistor, the number of contact holes decreases, thereby maximizing the storage capacitance.

Moreover, according to the embodiments of the present disclosure, since the switching transistor is configured as the top gate type and the driving transistor is configured as the bottom gate type, a thickness between the active part and the gate of the driving transistor may be adjusted, and thus, the driving voltage and the driving range of the driving transistor increase.

Moreover, according to the embodiments of the present disclosure, since the first conductor part configuring the switching channel can perform a function of the gate of the driving transistor (i.e., a function of the driving gate), the number of contact holes is reduced.

Moreover, according to the embodiments of the present disclosure, a thickness of the gate insulation layer of the switching transistor and a thickness of the gate insulation layer of the driving transistor may be differently set. Particularly, the thickness of the gate insulation layer of the driving transistor may be set greater than the thickness of the gate insulation layer of the switching transistor. Accordingly, the characteristic of the switching transistor is enhanced by decreasing the thickness of the gate insulation layer of the switching transistor, and a characteristic between the current Ids and the gate-source voltage Vgs of the driving transistor is enhanced by increasing the thickness of the gate insulation layer of the driving transistor. The first insulation layer 104 therefor acts as both the dielectric of capacitor Cst and the gate insulator for the driving transistor Tdr. Its thickness, dielectric constant and other properties can be selected to suitably perform both functions.

The first insulation layer 104 performs the dual purpose of being a gate insulator for transistor 129 and the dielectric for capacitor Cst2. Its thickness and dielectric properties are thus selected to perform both functions. The various properties of first insulation layer 104 are therefore balanced to suitable perform both functions as has been explained.

On the other hand, the primary role of second insulation layer 105 is to be dielectric for the capacitor Cst1. Therefore, the properties of second insulation layer 105, such as its thickness and dielectric constant, can be selected to obtain a desired capacitance value for Cst1 and thus for Cst as a whole. Thus, if some further tuning is needed to obtain the desired capacitance for Cst that can't be achieved because the value Cst2 will depend on the first insulation layer 104 also performing the gate insulator function for transistor 129, this tuning can be carried out by selecting the needed properties for second insulation layer 105 to compensate to achieve a target final value for the full capacitor Cst.

This structure that provides two different dielectric materials, 104 and 105 that can be independent selected to achieve a final target value of the end capacitor Cst provides significant benefits.

As can be seen, the capacitor of significantly higher capacitance value can be made by using the source (or drain) of a transistor as a first plate member, the source electrode (or drain electrode) as a physically separate member, but electrically connected to also be another first plate member and then have conductor positioned between them with an insulator on both sides of it to be the second plate of the capacitor. Thus, the capacitive value of the capacitor can be almost doubled, but using about the same layout area.

Further, in this particular design, the first conductor part 111 of a transistor performs three functions. It is the source of a first transistor. (It could also be the drain) It is also the gate of another transistor. It is also the plate of a capacitor. In some designs, it is desired to have a very compact transistor structure, which takes up a small footprint area so that the light emitting part of the structure can have larger relative area. The use of the first conductor of one transistor to be the gate of another transistor is particularly beneficially way to achieve this compact layout of two transistors with a small area. Added to this is the used of that same physical structure to be the plate of capacitor, providing a yet more compact transistor assembly. This permits the light emitting layers to take up more area in the layout of the overall display structure. Namely, the OLED as shown in FIG. 4 can now be a larger component relative to the other elements in each pixel as shown in FIG. 4.

It can also permit more pixels to be provided in the same area, thus enhancing the quality of the display.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. For example, the source and drain of an MOS transistor can be interchanged, depending on how the transistor is electrically connected and thus the terms source and drain can be interchanged with each other as used in the specification as appropriate at different times of operation or in other circuits.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transistor assembly comprising:
a substrate;
a switching channel provided on the substrate;
a gate insulation layer provided on the switching channel to overlap a switching active part of the switching channel;
a switching gate provided on the gate insulation layer to overlap the switching active part;
a first insulation layer overlying and covering the switching channel, the gate insulation layer, and the switching gate, the first insulation layer having a bottom surface and a top surface;
a driving channel provided overlying and on the first insulation layer;
a second insulation layer covering the driving channel and the first insulation layer;
a first electrode connected to a first conductor part of the switching channel and provided on the second insulation layer; and
a second electrode connected to a second conductor part of the switching channel and provided on the second insulation layer,
wherein the first conductor part of the switching channel is disposed as a single, integral member to fully overlap a driving active part of the driving channel to act as a driving gate for the driving channel,
wherein the bottom surface of the first insulation layer is in contact with the first conductor part of the switching channel and the top surface of the first insulation layer is in contact with the driving active part of the driving channel.

2. The transistor assembly of claim 1, further comprising a driving transistor that includes the first insulation layer as the driving transistor gate insulator and the driving channel as the channel of the driving transistor.

3. The transistor assembly of claim 1, wherein the first conductor part is a source of a switching transistor.

4. The transistor assembly of claim 1, wherein a third conductor part of the driving channel is disposed to overlap the first conductor part of the switching channel.

5. The transistor assembly of claim 4, wherein the third conductor part of the driving channel is a source of a driving transistor.

6. The transistor assembly of claim 1, wherein the first electrode is disposed to overlap a third conductor part of the driving channel.

7. The transistor assembly of claim 1, wherein
the first electrode is disposed to overlap a third conductor part of the driving channel, and a first storage capacitance is provided between the first electrode and the third conductor part, and
the third conductor part of the driving channel is disposed to overlap the first conductor part of the switching channel, and a second storage capacitance is provided between the first conductor part and the third conductor part.

8. The transistor assembly of claim 1, further comprising: a blocking layer provided in the driving channel to overlap the driving active part of the driving channel, the blocking layer being covered by the second insulation layer.

9. The transistor assembly of claim 1, wherein a thickness of the first insulation layer is greater than a thickness of the gate insulation layer.

10. An organic light emitting display panel comprising:
the transistor assembly of claim 1;
a passivation layer covering the first electrode, the second electrode, and the second insulation layer; and
an organic light emitting diode provided on the passivation layer.

11. The organic light emitting display panel of claim 10, wherein an anode of the organic light emitting diode is connected to a third conductor part of the driving channel.

12. An organic light emitting display device comprising:
the organic light emitting display panel of claim 10;
a gate driver supplying a gate pulse to a plurality of gate lines included in the organic light emitting display panel;
a data driver respectively supplying data voltages to a plurality of data lines included in the organic light emitting display panel; and
a controller controlling the gate driver and the data driver.

13. A transistor assembly comprising:
a substrate;
a switching transistor positioned on the substrate, the switching transistor including a switching channel, a gate insulation layer positioned on the switching channel to overlap a switching active part of the switching channel and a gate electrode positioned on the gate insulation layer, the switching channel including a source region, a drain region and the switching active part;
a first insulation layer overlying and covering the switching channel, the gate insulation layer, and the gate electrode;
a driving transistor having a driving channel overlying and on the first insulation layer, the first insulation layer acting as the gate dielectric to the driving transistor;
a second insulation layer overlying and covering the driving channel and the first insulation layer;
a first electrode connected to the source region of the switching transistor and positioned overlying the source region; and
a second electrode connected to the drain region of the switching transistor and positioned overlying the drain region,
wherein the source region of the switching channel extends as a single, integral member to be fully below the driving channel of the driving transistor and to act as a driving gate for the driving channel,
wherein the first electrode forms a first capacitor plate by extending laterally in a location positioned on the second insulation layer overlying an conductive region of the driving transistor that is below the second insulation layer, the conductive region of the driving transistor forming a second capacitor plate.

14. The transistor assembly of claim 13 wherein the conductive region of the driving transistor is the drain.

15. A light emitting diode assembly comprising:
a substrate;
a switching transistor positioned on the substrate, the switching transistor including a switching channel;
a source region of the switching transistor being coupled to a data line;
a drain region of the switching transistor being coupled to a driving transistor gate;
a gate insulation layer of the switching transistor being positioned on the switching channel to overlap a switching active part of the switching channel;
a gate electrode of the switching transistor being positioned on the gate insulation layer;
a first insulation layer overlying and covering the switching channel, the gate insulation layer, and the gate electrode;
a driving transistor having a driving channel overlying and on the first insulation layer, the first insulation layer acting as the gate dielectric to the driving transistor;
a second insulation layer overlying and covering the driving channel and the first insulation layer;
a first electrode connected to the source region of the switching transistor and positioned overlying the source region;
a second electrode connected to the drain region of the switching transistor and positioned overlying the drain region; and
a light emitting diode positioned above the switching transistor and the driving transistor,
wherein the source region of the switching channel extends as a single, integral member to be fully below by the driving channel of the driving transistor and to act as a driving gate for the driving channel,
wherein the first electrode forms a first capacitor plate by extending laterally in a location positioned on the second insulation layer overlying an conductive region of the driving transistor that is below the second insulation layer, the conductive region of the driving transistor forming a second capacitor plate.

16. The light emitting diode assembly of claim 15 wherein the light emitting diode is positioned overlying the driving transistor but not overlying the switching transistor.

17. The light emitting diode assembly of claim 15 further including a passivation layer positioned between the light emitting diode and the switching transistor and the driving transistor.

* * * * *